US011214853B2

(12) United States Patent
Michiuchi et al.

(10) Patent No.: US 11,214,853 B2
(45) Date of Patent: Jan. 4, 2022

(54) HARD MATERIAL AND CUTTING TOOL

(71) Applicant: SUMITOMO ELECTRIC INDUSTRIES, LTD., Osaka (JP)

(72) Inventors: Masato Michiuchi, Itami (JP); Kosuke Fukae, Itami (JP); Keiichi Tsuda, Itami (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 400 days.

(21) Appl. No.: 16/324,919

(22) PCT Filed: May 29, 2017

(86) PCT No.: PCT/JP2017/019873

§ 371 (c)(1),
(2) Date: Feb. 12, 2019

(87) PCT Pub. No.: WO2018/037651

PCT Pub. Date: Mar. 1, 2018

(65) Prior Publication Data

US 2020/0391298 A1 Dec. 17, 2020

(30) Foreign Application Priority Data

Aug. 22, 2016 (JP) ............................ JP2016-161987

(51) Int. Cl.

| | |
|---|---|
| ***B23B 27/14*** | (2006.01) |
| ***C22C 29/04*** | (2006.01) |
| *C23C 14/06* | (2006.01) |
| *C23C 16/36* | (2006.01) |

(52) U.S. Cl.
CPC ............ *C22C 29/04* (2013.01); *B23B 27/148* (2013.01); *B23B 2224/32* (2013.01); *B23B 2228/10* (2013.01); *C23C 14/0664* (2013.01); *C23C 16/36* (2013.01)

(58) Field of Classification Search
CPC .............................. B23B 27/148; C22C 29/04
USPC .................................................. 428/325, 698
See application file for complete search history.

(56) References Cited

U.S. PATENT DOCUMENTS

| | | | | |
|---|---|---|---|---|
| 2014/0356215 A1* | 12/2014 | Yamazaki | ................. | B22F 3/15 419/13 |
| 2016/0130687 A1* | 5/2016 | Yamanishi | ............. | C22C 29/10 428/325 |
| 2016/0221080 A1 | 8/2016 | Higashi et al. | | |

(Continued)

FOREIGN PATENT DOCUMENTS

| | | |
|---|---|---|
| JP | H06-081071 A | 3/1994 |
| JP | H07-224346 A | 8/1995 |
| JP | 2002-60802 A | 2/2002 |

(Continued)

*Primary Examiner* — Archene A Turner
(74) *Attorney, Agent, or Firm* — Faegre Drinker Biddle & Reath LLP

(57) ABSTRACT

A hard material includes a first hard phase containing titanium carbonitride as a major constituent and a binder phase containing an iron group element as a major constituent. In any surface or cross-section of the hard material, the grain size D50 at a cumulative percentage of 50% of a grain size distribution by area of the first hard phase is 1.0 μm or more, and the average aspect ratio of first hard phase particles having grain sizes larger than or equal to D50 is 2.0 or less.

6 Claims, 6 Drawing Sheets

Sample No. 2-1

1 μm

(56) References Cited

U.S. PATENT DOCUMENTS

2018/0036806 A1* 2/2018 Michiuchi ............. B23B 27/148

FOREIGN PATENT DOCUMENTS

| | | | |
|---|---|---|---|
| JP | 2006-131975 | A | 5/2006 |
| JP | 2007-231421 | A | 9/2007 |
| JP | 2011-093006 | A | 5/2011 |
| JP | 2015-203118 | A | 11/2015 |

* cited by examiner

Sample No. 1-1

Sample No. 1-11

Sample No. 1-12

1 μm

Sample No. 2-1

Sample No. 2-11

Sample No. 2-12

HARD MATERIAL AND CUTTING TOOL

TECHNICAL FIELD

The present invention relates to hard materials and cutting tools.

This application claims priority to Japanese Patent Application No. 2016-161987, filed Aug. 22, 2016, the entire contents of which are incorporated herein by reference.

BACKGROUND ART

PTL 1 discloses a titanium carbonitride powder as a starting material for a cutting tool (hard material). As a method for manufacturing this titanium carbonitride powder, PTL 1 discloses that titanium hydride and carbon powder are provided as starting materials, are mixed and pulverized in a ball mill, and are heat-treated at a temperature of 1,400° C. to 1,700° C. in a nitrogen-containing atmosphere, followed by pulverization to an average grain size of 3 μm or less (in the test examples, 1.5 μm or less).

CITATION LIST

Patent Literature

PTL 1: Japanese Unexamined Patent Application Publication No. 2002-60802

SUMMARY OF INVENTION

A hard material according to the present disclosure is a hard material including a first hard phase containing titanium carbonitride as a major constituent and a binder phase containing an iron group element as a major constituent, wherein, in any surface or cross-section of the hard material, the grain size D50 at a cumulative percentage of 50% of a grain size distribution by area of the first hard phase is 1.0 μm or more, and the average aspect ratio of first hard phase particles having grain sizes larger than or equal to D50 is 2.0 or less.

A cutting tool according to the present disclosure includes the hard material according to the present disclosure as a substrate.

DESCRIPTION OF EMBODIMENTS

Problems to be Solved by Disclosure

Figure 1:
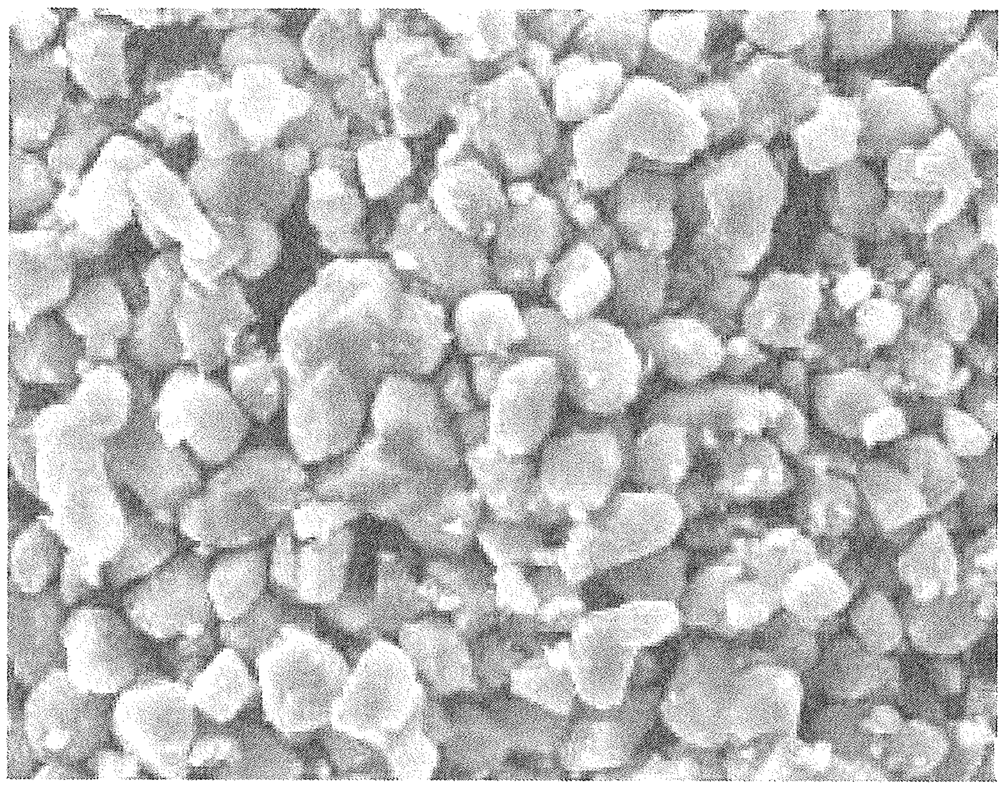
FIG. 1 is a field-emission scanning electron micrograph of a titanium carbonitride powder of Sample No. 1-1 in Test Example 1.

Recently, cutting tools have been used under severe conditions because, for example, workpieces have become increasingly difficult to cut in cutting processes and have also been machined into more complicated shapes. Accordingly, there is a need for a hard material with a higher fracture toughness and thermal conductivity.

Since the titanium carbonitride powder disclosed in PTL 1 has a relatively small average grain size, a hard material manufactured using this powder as a starting material includes a fine hard phase containing titanium carbonitride as a major constituent and thus has superior hardness; however, it tends to exhibit decreased fracture toughness. In addition, this titanium carbonitride powder tends to have variations in the grain size of the powder because mixing is performed with pulverization during manufacture. If there are variations in the grain size of the powder, dissolution and reprecipitation tend to occur during the process of manufacturing the hard material. This tends to promote the growth of a surrounding structure formed of a solid solution of titanium carbonitride and carbides added as minor constituents (e.g., tungsten carbide and niobium carbide). This overgrown surrounding structure tends to result in decreased thermal conductivity.

Accordingly, an object is to provide a hard material with superior fracture toughness and thermal conductivity.

Another object is to provide a cutting tool with superior fracture toughness and thermal conductivity.

Advantageous Effects of Disclosure

The hard material and the cutting tool have superior fracture toughness and thermal conductivity.

Description of Embodiments of Invention

First, a list of embodiments of the present invention will be described.

(1) A hard material according to an embodiment of the present invention is a hard material including a first hard phase containing titanium carbonitride as a major constituent and a binder phase containing an iron group element as a major constituent, wherein, in any surface or cross-section of the hard material, the grain size D50 at a cumulative percentage of 50% of a grain size distribution by area of the first hard phase is 1.0 μm or more, and the average aspect ratio of first hard phase particles having grain sizes larger than or equal to D50 is 2.0 or less.

Since the first hard phase containing titanium carbonitride as a major constituent has a D50 of 1.0 μm or more, that is, is coarse, the fracture toughness can be improved by a crack-propagation inhibiting effect (crack deflection effect).

Since coarse first hard phase particles, containing titanium carbonitride as a major constituent, that have grain sizes larger than or equal to D50 have an average aspect ratio of 2.0 or less, the propagation of developing cracks through the particles can be inhibited. Coarse first hard phase particles having an average aspect ratio of 2.0 or less, that is, coarse first hard phase particles having a cross-sectional shape close to a circle, can be obtained, for example, using a titanium carbonitride powder having a uniform grain size distribution as a starting material by not performing excessive pulverization during the manufacturing process. A titanium carbonitride powder having a nonuniform grain size distribution, like that disclosed in PTL 1, exhibits low sinterability; therefore, excessive pulverization needs to be performed in order to improve the sinterability. However, excessive pulverization forms a finely pulverized titanium carbonitride powder, which tends to undergo Ostwald ripening (dissolution and reprecipitation phenomenon) during liquid-phase sintering and thus tends to form a solid solution of titanium carbonitride and carbides added as minor constituents (e.g., tungsten carbide and niobium carbide). This solid solution tends to decrease the thermal conductivity as a result of phonon scattering. Excessive pulverization also forms particles having irregular shapes with sharp corners even if the starting material used is circular in cross-section. These irregular shapes are directly reflected on the structure after sintering; therefore, a hard phase having an average aspect ratio of more than 2.0 tends to be formed. Thus, since the coarse first hard phase particles have an average aspect ratio of 2.0 or less, the formation of fine powder during the manufacturing process and the formation of a solid solution due to the presence of fine powder can be inhibited, thus improving the thermal conductivity of the hard material.

(2) As an example of the hard material, in the surface or cross-section, the grain size D20 at a cumulative percentage of 20% of the grain size distribution by area of the first hard phase may be 0.7 μm or more.

If D20 is 0.7 μm or more, that is, if the grain size of 80% by area or more of the first hard phase is 0.7 μm or more, the fracture toughness and thermal conductivity of the hard material can be further improved.

(3) As an example of the hard material, the area fraction of the first hard phase in the surface or cross-section may be 30% or more.

If the area fraction of the first hard phase is 30% or more, the thermal conductivity of the hard material can be further improved.

(4) As an example of the hard material, the hard material may further include a second hard phase consisting of one or more of carbides, nitrides, carbonitrides, and solid solutions thereof containing one or more metal elements selected from elements in groups 4, 5, and 6 of the periodic table (excluding titanium carbonitride).

If the hard material further includes the second hard phase, the hard material exhibits superior hardness.

(5) A cutting tool according to an embodiment of the present invention includes the hard material according to any one of (1) to (4) above as a substrate.

Since the cutting tool includes a hard material with superior fracture toughness and thermal conductivity as a substrate, the cutting tool offers advantages such as machining under more severe cutting conditions and a longer life.

(6) As an example of the cutting tool, the cutting tool may have a hard coating on at least a portion of a surface of the substrate.

If the cutting tool has a hard coating on the surface of the substrate, the hard coating improves, for example, the wear resistance of the cutting tool. Thus, the cutting tool offers advantages such as compatibility with even more severe cutting conditions and an even longer life.

Details of Embodiments of Invention

Details of embodiments of the present invention will hereinafter be described. It should be understood that the invention is not limited to these examples, but is indicated by the claims, and all changes that come within the meaning and range of equivalency of the claims are intended to be embraced therein.

[Hard Material]

A hard material according to an embodiment is composed of a hard phase, a binder phase that binds the hard phase, and incidental impurities. The hard phase includes a first hard phase containing titanium carbonitride (TiCN) as a major constituent and optionally a second hard phase different from the first hard phase. The incidental impurities may be oxygen and metal elements in concentrations on the order of ppm (by mass) that are contained in the starting materials or are mixed during the manufacturing process. One of the features of the hard material according to the embodiment is that the first hard phase is coarse and circular in cross-section.

The composition of each hard phase can be easily determined by observing a surface or cross-section of the hard material under a light microscope or by subjecting a surface or cross-section of the hard material to image analysis by scanning electron microscopy (SEM) and energy-dispersive X-ray spectrometry (EDS) (EDS area analysis).

<<Hard Phase>>

First Hard Phase

The first hard phase contains TiCN as a major constituent. Here, the first hard phase containing TiCN as a major constituent refers to a phase substantially composed only of TiCN. It should be understood that the first hard phase may contain approximately a few percent by mass (from about 0.01% by mass to about 2.0% by mass) of incidental impurities (e.g., tungsten) that are mixed during the manufacturing process. As for structural morphology, the first hard phase may be present as particles precipitated alone in the hard material or may be present so as to form a so-called cored structure in which the second hard phase, described later, covers at least a portion of the periphery of the first hard phase. For any morphology, the TiCN portions are referred to as the first hard phase.

In any surface or cross-section of the hard material, the grain size D50 at a cumulative percentage of 50% of a grain size distribution by area of the first hard phase satisfies 1.0 μm or more; that is, the first hard phase is coarse. Since the first hard phase is coarse, the fracture toughness of the hard material can be improved by a crack-propagation inhibiting effect (crack deflection effect). The first hard phase preferably has a D50 of 1.2 μm or more, particularly 1.6 μm or more.

Here, "grain size" refers to the maximum Feret diameter determined by mirror-finishing any surface or cross-section of the hard material, capturing an image of the machined surface under a microscope, and subjecting the captured image to image analysis. It is preferred to perform measurements on at least 100 or more first hard phase particles, preferably 200 or more first hard phase particles. It is also preferred to perform the image analysis in a plurality of fields of view for the same hard material to determine the average grain size thereof as the grain size of the first hard phase. It is preferred to select five or more fields of view, more preferably seven or more fields of view.

Examples of mirror-finishing techniques include polishing with a diamond paste, the use of a cross-section polisher system (CP system), and a combination thereof. Examples of types of microscopes include scanning electron microscope (SEM) and field-emission scanning electron microscope (FE-SEM). An image captured under a microscope is sent to a computer and is analyzed with image analysis software (e.g., "Image J") to acquire various types of information such as grain size. The analytical technique using the image analysis software "Image J" will be described in detail in the Test Examples later.

The average aspect ratio of first hard phase particles having grain sizes larger than or equal to D50 satisfies 2.0 or less. That is, the coarse first hard phase particles have a cross-sectional shape close to a circle. Since the coarse first hard phase particles are circular in cross-section, the growth of a surrounding structure surrounding the first hard phase (a solid solution of titanium carbonitride and carbides added as minor constituents (e.g., tungsten carbide and niobium carbide)) can be consequently inhibited, thus improving the thermal conductivity. The first hard phase preferably has an aspect ratio of 1.8 or less, particularly 1.7 or less.

Here, "aspect ratio" refers to the major-to-minor axis ratio (major axis/minor axis) of an ellipse approximating the shape of the first hard phase in any surface or cross-section of the hard material. As with the grain size described above, the aspect ratio can be determined by mirror-finishing any surface or cross-section of the hard material, capturing an image of the machined surface under a microscope, and analyzing the captured image with image analysis software.

In any surface or cross-section of the hard material, the grain size D20 at a cumulative percentage of 20% of the grain size distribution by area of the first hard phase preferably satisfies 0.7 μm or more. If D20 is 0.7 μm or more, that is, if the grain size of 80% by area or more of the first hard phase is 0.7 μm or more, the fracture toughness and thermal conductivity of the hard material can be further improved. The first hard phase preferably has a D20 of 0.8 μm or more, particularly 1.0 μm or more.

The area fraction of the first hard phase in any surface or cross-section of the hard material is preferably 30% or more. If the first hard phase is contained in an amount of 30% by area or more, the thermal conductivity of the hard material can be further improved. The area fraction of the first hard phase is preferably 35% or more, particularly 40% or more.

Second Hard Phase

The second hard phase consists of one or more of carbides, nitrides, carbonitrides, and solid solutions thereof containing one or more metal elements selected from elements in groups 4, 5, and 6 of the periodic table (excluding titanium carbonitride). Examples of metal elements selected from elements in groups 4, 5, and 6 of the periodic table include titanium (Ti), tungsten (W), tantalum (Ta), niobium (Nb), vanadium (V), chromium (Cr), molybdenum (Mo), and zirconium (Zr).

Specific examples of second hard phases include Ti-containing binary complex carbonitride solid solutions such as WC, TiWC, TiWCN, TiWN, TiZrCN, TiTaCN, TiNbCN, TiVCN, TiCrCN, and TiMoCN; Ti-containing ternary complex carbonitride solid solutions such as TiZrNbCN; and Ti-containing multinary complex carbonitride solid solutions such as TiZrWNbCN and TiZrWTaNbCN; and NbWC and NbWCN, which contain no Ti.

The second hard phase may have any grain size. As an example, the grain size D50 at a cumulative percentage of 50% of a grain size distribution by area of the second hard phase may be from 0.5 μm to 3.0 μm.

The area fraction of the second hard phase in any surface or cross-section of the hard material may be from 20% to 60%. If the second hard phase is contained in an amount of 20% by area or more, the hard material exhibits superior hardness. On the other hand, if the area fraction of the second hard phase is 60% or less, the amount of the first hard phase is relatively increased, so that the hard material exhibits superior fracture toughness and thermal conductivity. The area fraction of the second hard phase may be from 25% to 55%, particularly from 25% to 45%.

The hard phases in the hard material may account for 80% by volume or more, or 85% by volume or more, of the total volume of the hard material. On the other hand, the hard phases in the hard material may account for 96% by volume or less, or 90% by volume or less, of the total volume of the hard material.

<<Binder Phase>>

The binder phase contains an iron group element as a major constituent and binds the hard phases. The major constituent means that the iron group element is contained in an amount of 50% by mass or more of the total mass of the binder phase. Typical examples of iron group elements that form the binder phase include nickel (Ni), cobalt (Co), and iron (Fe). These may be used alone or in combination. The binder phase may also contain the constituents of the hard phases, such as tungsten and carbon, and other incidental constituents.

The binder phase may also contain at least one of chromium (Cr) and vanadium (V). These elements can be derived from, for example, grain growth inhibitors, which are optionally used during the process of manufacturing the hard material. If these elements are present in the binder phase, they are believed to be at least partially present in the form of a solid solution in the binder phase.

The binder phase is preferably present in an amount of from 4% by volume to 20% by volume of the total volume of the hard material. If the binder phase is present in the hard material in an amount of 4% by volume or more, a decrease in sinterability during manufacture is prevented, and the binder phase firmly binds the hard phases, so that the hard material has high strength and is resistant to fracture. In addition, if the binder phase is present in the hard material in an amount of 4% by volume or more, the toughness of the hard material is improved. On the other hand, if the binder phase is present in the hard material in an amount of 20% by volume or less, the decrease in the hardness of the hard material due to the relative decrease in the amount of hard phase can be reduced, thus reducing the decrease in wear resistance and plastic deformation resistance. The binder phase is preferably present in the hard material in an amount of from 10% by volume to 20% by volume, particularly from 10% by volume to 15% by volume.

[Method for Manufacturing Hard Material]

Typically, the hard material described above can be manufactured through the steps of providing starting powders, mixing, compaction, and sintering. The individual steps will hereinafter be described in detail.

<<Providing Step>>

The providing step is a step of providing a hard phase powder and a binder phase powder. As the hard phase powder, a titanium carbonitride (TiCN) powder that forms the first hard phase (first hard phase powder) is provided. As an optional hard phase powder, a powder of one or more of carbides, nitrides, carbonitrides, and solid solutions thereof containing one or more metal elements selected from elements in groups 4, 5, and 6 of the periodic table (excluding titanium carbonitride) (second hard phase powder) is also provided. As the binder phase powder, an iron group metal powder that forms the binder phase is provided.

As one of the conditions for forming a first hard phase that is coarse and circular in cross-section in the hard material, a coarse and uniformly sized TiCN powder may be used. A TiCN powder having a particle shape close to a sphere may also be used. The TiCN powder preferably satisfies a D50 of from 2.0 μm to 6.0 μm (i.e., coarse) and a D10/D90 of from 0.20 to 0.50 (i.e., uniformly sized), where D50, D10, and D90 are the grain sizes at cumulative percentages of 50%, 10%, and 90%, respectively, of a grain size distribution by volume. Such a coarse and uniformly sized TiCN powder can be obtained, for example, as follows.

<Method for Manufacturing TiCN Powder>

Typically, the TiCN powder can be manufactured through the steps of providing starting powders, mixing, granulation, heat treatment, and de-agglomeration.

(Providing Step)

In the providing step during powder manufacture, starting powders are provided, including titanium oxide powder and carbon powder. The use of uniformly sized starting powders tends to provide a uniformly sized powder after the heat treatment step described later.

The titanium oxide powder may have any crystal structure, such as anatase or rutile, and commercially available products can be used. The titanium oxide powder may have an average grain size of from 0.1 μm to 1 μm. The average grain size of the starting powders refers to the average grain size determined by the Fisher Sub-Sieve Sizer (FSSS) method (FSSS size). If the titanium oxide powder has an average grain size of 1 μm or less, the contact area of the titanium oxide powder with the carbon powder can be increased, thus allowing a reduction and nitridation reaction to proceed quickly in the heat treatment step described later. On the other hand, if the titanium oxide powder has an average grain size of 0.1 μm or more, the starting powder is easy to handle. The titanium oxide powder may have an average grain size of from 0.3 μM to 0.7 μm particularly from 0.45 μm to 0.6 μm.

As the carbon powder, amorphous carbon (e.g., charcoal, soot, or coke) can be used. The carbon powder may have an average grain size of 1 μm or less. If the carbon powder has an average grain size of 1 μm or less, the contact area of the titanium oxide powder with the carbon powder can be increased, thus allowing a reduction and nitridation reaction to proceed quickly in the heat treatment step described later.

The mixing ratio of the titanium oxide powder to the carbon powder can be appropriately selected depending on the carbon-to-nitrogen ratio of the TiCN powder obtained in the heat treatment step described later. For example, the mixing ratio of the titanium oxide powder to the carbon powder may be, by mass, 74.3:25.7 to 71.1:28.9, or 73.5:26.5 to 71.9:28.1, particularly 73.1:26.9 to 72.3:27.7.

(Mixing Step)

In the mixing step during powder manufacture, the starting powders provided in the providing step are mixed substantially without pulverization to obtain a mixed powder. As one of the conditions for obtaining a coarse and uniformly sized TiCN powder having a particle shape close to a sphere, the starting powders may be mixed under mixing conditions where the starting powders are not pulverized. If the starting powders are mixed without pulverization, the grain size and shape of the starting powders remain substantially the same before and after mixing, and the heat treatment step described later can be performed while the uniform grain size and spherical shape of the starting powders are maintained. Examples of machines for use in the mixing step during powder manufacture include dry airflow mixers with impellers, ultrasonic wet mixers, and vortex wet mixers. For example, machines such as Henschel mixers and attritors can be used. If a Henschel mixer is used, example mixing conditions are as follows: rotational speed=from 1,200 rpm to 1,800 rpm; mixing time=from 30 minutes to 90 minutes.

(Granulation Step)

In the granulation step during powder manufacture, the mixed powder obtained in the mixing step is granulated and sized to obtain a granulated powder. Known granulation processes using machines such as tableting machines and extrusion granulators can be employed for granulation.

Granulation improves the handleability of the powder and also reduces variations in the quality of the powder after the heat treatment step described later. The granulation binder may be any binder, such as dextrin. The granulated powder may have any shape, such as a sphere with a diameter of about 3 mm to 5 mm, a cylinder with a diameter of about 1 mm to 2 mm and a length of about 2 mm to 5 mm, or a tablet with a diameter of about 1 mm to 5 mm and a height of about 1 mm to 2 mm. If the granulated powder is excessively large in size, the center of the granulated powder may remain unreacted after the heat treatment step described later; therefore, the granulated powder should have a size that allows it to be nitrided to the center thereof. Granulation and sizing are followed by drying (at about 150° C.).

(Heat Treatment Step)

The heat treatment step during powder manufacture is a step of heating the granulated powder obtained in the granulation step in a nitrogen-containing atmosphere to obtain a titanium carbonitride powder (granules). As one of the conditions for obtaining a coarse TiCN powder, the heat treatment temperature may be from higher than 2,000° C. to 2,500° C. If the heat treatment temperature is higher than 2,000° C., the grain growth of the powder can be promoted, so that a coarse TiCN powder can be obtained. On the other hand, if the heat treatment temperature is 2,500° C. or lower, excessive grain growth can be inhibited, thus ensuring sufficient sinterability during the manufacture of the hard material. The heat treatment temperature is preferably from 2,050° C. to 2,400° C., particularly from 2,150° C. to 2,300° C.

The heating rate from room temperature to the heat treatment temperature may be 5° C./min or higher. If the heating rate is 5° C./min or higher, the time for grain growth is shortened, thus inhibiting abnormal grain growth. The heating rate to the heat treatment temperature is preferably 10° C./min or higher, particularly 15° C./min or higher.

The heat treatment time may be from 0.5 hours to 2.0 hours. If the heat treatment time is 0.5 hours or more, the grain growth of the powder tends to be promoted, so that a coarse TiCN powder can be obtained. On the other hand, if the heat treatment time is 2.0 hours or less, the aggregation of the powder tends to be inhibited. The heat treatment time is preferably from 0.6 hours to 1.5 hours, particularly from 0.75 hours to 1.25 hours.

The heat treatment atmosphere is a nitrogen-containing atmosphere, such as a single atmosphere of nitrogen ($N_2$) alone, an ammonia ($NH_3$) atmosphere, or a mixed gas atmosphere of a nitrogen-containing gas such as nitrogen ($N_2$) or ammonia with an inert gas such as Ar.

The heat treatment furnace used for heat treatment may be, for example, a batch vacuum atmosphere furnace or a continuous rotary kiln furnace.

Heating at the heat treatment temperature may be followed by cooling to room temperature, for example, at a cooling rate of from 5° C./min to 40° C./min.

(De-Agglomeration Step)

The TiCN powder obtained in the heat treatment step is in granular form. These granules can be disintegrated, for example, in a mortar by hand, to obtain a particulate TiCN powder.

In the method for manufacturing a TiCN powder described above, the granulation step and the de-agglomeration step can be omitted. In this case, the mixed powder obtained in the mixing step may be heated in the heat treatment step. In this case, the de-agglomeration step need not be performed since the TiCN powder obtained after the heat treatment step is in particulate form.

<TiCN Powder>

The TiCN powder obtained by the method for manufacturing a TiCN powder described above satisfies a D50 of from 2.0 μm to 6.0 μm (i.e., coarse) and a D10/D90 of from 0.20 to 0.50 (i.e., uniformly sized). D50, D10, and D90 can be measured with a commercially available grain size distribution analyzer (laser diffraction/scattering grain size distribution analyzer). In addition, the TiCN powder obtained by the method for manufacturing a TiCN powder described above is composed of particles having a shape close to a sphere.

Since the TiCN powder has a D50 of 2.0 μm or more, a hard material manufactured using this powder as a starting material includes a coarse first hard phase, which improves the fracture toughness by a crack-propagation inhibiting effect (crack deflection effect). As the D50 of the TiCN powder becomes larger, the first hard phase in the resulting hard material becomes coarser; however, the sinterability during the process of manufacturing the hard material would be adversely affected. Thus, the TiCN powder has a D50 of 6.0 μm or less so that sufficient sinterability can be ensured during the manufacture of the hard material. The TiCN powder preferably has a D50 of from 2.1 μm to 4.0 μm, particularly from 2.5 μm to 3.5 μm.

Since the TiCN powder has a D10/D90 of 0.20 or more, its grain size distribution is narrow and sharp, so that dissolution and reprecipitation can be inhibited during sintering in the process of manufacturing a hard material using this powder as a starting material. Therefore, a hard material manufactured using this powder as a starting material includes a uniformly sized first hard phase, which inhibits the growth of a surrounding structure surrounding the first hard phase and thus improves the thermal conductivity. On the other hand, since the TiCN powder has a D10/D90 of 0.50 or less, sufficient sinterability can be ensured during the manufacture of the hard material. The TiCN powder preferably has a D10/D90 of from 0.22 to 0.45, particularly from 0.24 to 0.40.

The TiCN powder preferably shows an X-ray diffraction peak with a small full width at half maximum as measured with Cu Kα X-rays. The crystallinity of TiCN can be determined, for example, from the full width at half maximum. As the crystallinity of TiCN becomes higher, that is, as the crystal structure of TiCN contains fewer defects, its peak tends to have a smaller full width at half maximum and become sharper. As the crystallinity of TiCN becomes higher, the mechanical strength of a hard material manufactured using this powder as a starting material can be improved.

It is preferred that all peaks of the (2,0,0), (2,2,0), and (2,2,2) planes of the TiCN powder have a full width at half maximum of from 0.03° to 0.20°. If all these peaks satisfy a full width at half maximum of from 0.03° to 0.20°, a hard material with superior TiCN crystallinity and therefore superior mechanical strength can be obtained. The peak of the (2,0,0) plane preferably has a full width at half maximum of from 0.06° to 0.16°, particularly from 0.09° to 0.12°. The peak of the (2,2,0) plane preferably has a full width at half maximum of from 0.06° to 0.16°, particularly from 0.09° to 0.12°. The peak of the (2,2,2) plane preferably has a full width at half maximum of from 0.05° to 0.13°, particularly from 0.07° to 0.11°.

<Second Hard Phase Powder>

The second hard phase powder may be, for example, tungsten carbide (WC) powder, tantalum carbide (TaC) powder, niobium carbide (NbC) powder, vanadium carbide (VC) powder, trichromium dicarbide ($Cr_3C_2$) powder, dimolybdenum carbide ($Mo_2C$) powder, or zirconium carbonitride (ZrCN) powder. The average grain size of the second hard phase powder may be, but not limited to, from 0.2 μm to 5.0 μm, or from 0.5 μm to 2.0 μm, and can be appropriately selected as long as the sinterability of the hard material is not decreased. The second hard phase powder used herein may change into a solid solution through a dissolution and reprecipitation reaction during the process of sintering the hard material; therefore, the second hard phase in the hard material is not necessarily identical to the second hard phase powder used as a starting material.

<Binder Phase Powder>

The binder phase powder may be, for example, cobalt (Co) powder or nickel (Ni) powder. The average grain size of the binder phase powder may be, but not limited to, from 0.5 μm to 2.0 μm or from 0.8 μm to 1.0 μm, and can be appropriately selected as long as the sinterability of the hard material is not decreased.

<<Mixing Step>>

The mixing step is a step of mixing the starting powders provided in the providing step. As one of the conditions for forming a first hard phase that is coarse and circular in cross-section in the hard material, the provided starting powders, particularly the TiCN powder, may be mixed under mixing conditions where they are substantially not pulverized. If the starting powders are mixed without pulverization, the grain size and shape of the starting powders remain substantially the same before and after mixing, and the sintering step described later can be performed while the uniform grain size and spherical shape of the starting powders are maintained. Known machines can be used for the mixing step. For example, machines such as attritors, tumbling ball mills, and bead mills can be used. As the mixing conditions, either wet mixing or dry mixing may be employed. Mixing may be performed in a solvent such as water, ethanol, acetone, or isopropyl alcohol.

<<Compaction Step>>

The compaction step is a step of compacting the mixed powder obtained in the mixing step into a predetermined shape to obtain a compact. Any common compaction process and any common compaction conditions may be employed for the compaction step. The predetermined shape may be, for example, a cutting tool shape.

<<Sintering Step>>

The sintering step is a step of sintering the compact obtained in the compaction step to obtain a sintered body. Sintering may be performed at a temperature of from 1,400° C. to 1,600° C. for a period of time of from 0.25 hours to 1.5 hours. The sintering atmosphere may be any atmosphere, such as a $N_2$ gas atmosphere, an inert gas atmosphere such as Ar, or a vacuum atmosphere.

[Cutting Tool]

<<Substrate>>

A cutting tool according to an embodiment is a cutting tool including a hard material as a substrate. One of the features of the cutting tool according to the embodiment is that the cutting tool includes the hard material described above as a substrate. This provides a cutting tool with superior fatigue toughness and thermal shock resistance.

The cutting tool may have any shape. Examples of cutting tools include turning tools, ball mills, end mills, drills, and reamers. In particular, examples of turning tools and other cutting tools include indexable inserts.

<<Hard Coating>>

The cutting tool may have a hard coating on the substrate. Example compositions for the hard coating include carbides, nitrides, oxides, borides, and solid solutions thereof containing one or more elements selected from metal elements in groups 4, 5, and 6 of the periodic table, aluminum (Al), and silicon (Si). For example, compositions such as Ti(C,N), $Al_2O_3$, (Ti,Al)N, TiN, TiC, and (Al,Cr)N may be employed. Other compositions suitable for the hard coating include cubic boron nitride (cBN) and diamond-like carbon. Such hard coatings can be formed by gas-phase processes such as chemical vapor deposition (CVD) and physical vapor deposition (PVD). The formation of the hard coating by CVD tends to provide a hard coating with superior adhesion to the substrate. An example of CVD is thermal CVD. The formation of the hard coating by PVD tends to apply a compressive residual stress to the hard coating and thus increase its toughness.

The hard coating is preferably disposed on and around a portion of the substrate that serves as a cutting edge or may be disposed over the entire surface of the substrate. The hard coating may be composed of a single layer or a plurality of layers. The hard coating may have a thickness of from 1 μm to 20 μm, or from 1.5 μm to 15 μm.

TEST EXAMPLES

Test Example 1

In Test Example 1, titanium carbonitride powders serving as starting powders for hard materials (Sample Nos. 1-1 to 1-5, 1-11, and 1-12) were prepared and assessed.

<<Sample Preparation>>

Sample No. 1-1

As starting powders, titanium oxide powder (average grain size=0.18 μm; purity=more than 98%) and amorphous carbon powder (average grain size=0.18 μm; purity=more than 98%) were provided (providing step).

The average grain sizes of the starting powders were determined by the FSSS method. The titanium oxide powder and the carbon powder were blended in a mass ratio of 4:1 and were mixed without pulverization in a Henschel mixer to obtain a mixed powder (mixing step). The mixing conditions were as follows: rotational speed=1,500 rpm; mixing time=1 hour; dry airflow mixing. The resulting mixed powder was blended with dextrin as a binder and was granulated and sized into pellets with a diameter of about 2 mm and a length of 2 to 5 mm, followed by drying at a temperature of 150° C. to obtain a granulated powder (granulation step). The resulting granulated powder was heated in a nitrogen stream (1 atm) at a heat treatment temperature of 2,200° C. for a heat treatment time of 1 hour to obtain a pelletized titanium carbonitride powder (heat treatment step). The heating rate from room temperature to 2,200° C. was 20° C./min, and the cooling rate from 2,200° C. to room temperature was 20° C./min. The pelletized titanium carbonitride powder was then disintegrated in a mortar by hand to obtain a particulate titanium carbonitride powder (de-agglomeration step).

Sample Nos. 1-2, 1-3, and 1-11

Titanium carbonitride powders were prepared with varying heat treatment temperatures in the heat treatment step. The heat treatment temperature was as follows: 2,000° C. for Sample No. 1-2; 2,300° C. for Sample No. 1-3; 1,700° C. for Sample No. 1-11. The conditions other than the heat treatment temperature were identical to those for Sample No. 1.

Sample No. 1-4

A titanium carbonitride powder was prepared with a heat treatment time of 0 hour in the heat treatment step. That is, in the heat treatment step of Sample No. 4, heating from room temperature to 2,200° C. at a heating rate of 20° C./min was immediately followed by cooling to room temperature at a cooling rate of 20° C./min. The conditions other than the heat treatment time were identical to those for Sample No. 1.

Sample No. 1-5

A titanium carbonitride powder was prepared by mixing the titanium oxide powder and the carbon powder with tungsten powder and cobalt powder as impurities, each in an amount of 0.5% by mass on a titanium carbonitride basis, in the mixing step. The other conditions were identical to those for Sample No. 1.

Sample No. 1-12

As a comparative product, a titanium carbonitride powder was prepared by the method of manufacture disclosed in PTL 1. Specifically, as starting powders, titanium hydride (average grain size=0.18 μm; purity=98%) and carbon powder (average grain size=0.18 μm; purity=98%) were provided. In addition, tungsten carbide powder and cobalt powder were provided such that the $TiC_{0.5}N_{0.5}$ powder obtained after the heat treatment step had a tungsten content of 0.8% by mass and a cobalt content of 0.3% by mass based on a $TiC_{0.5}N_{0.5}$ basis. These powders were mixed and pulverized in a ball mill, and the mixed powder was heat-treated in a nitrogen-containing atmosphere at 1,600° C. for 1.0 hour, followed by pulverization to 1.2 μm.

<<Measurement of Grain Size Distribution>>

Figure 2:
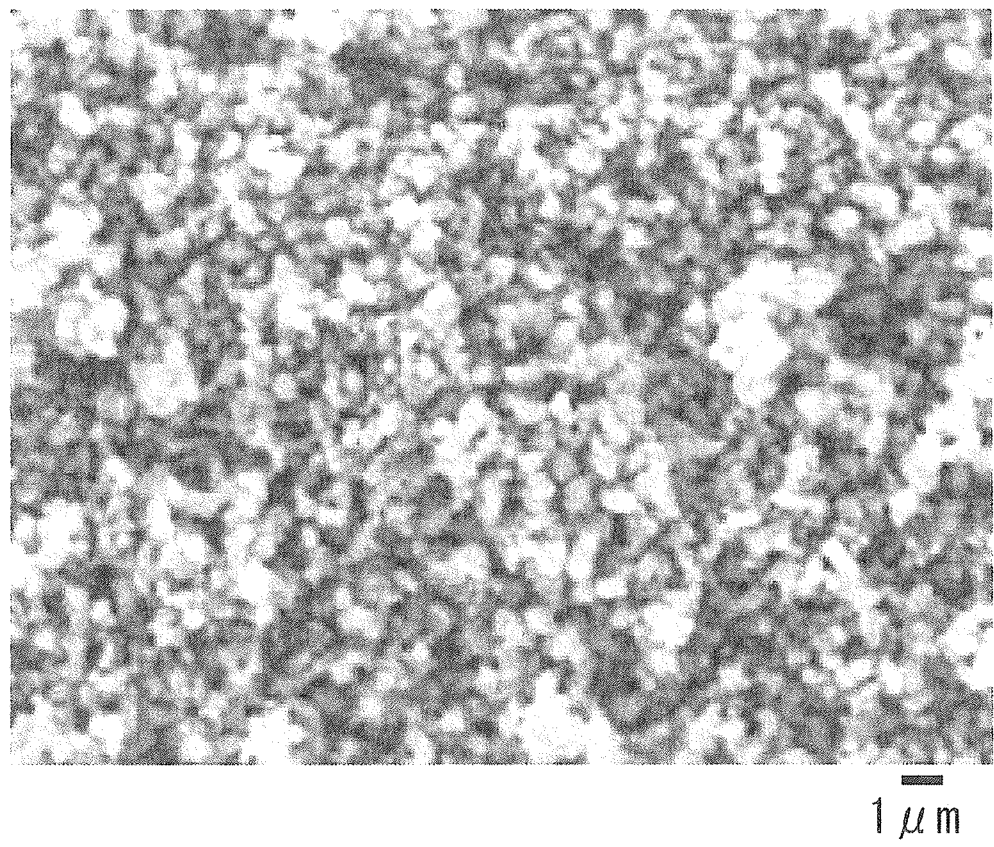
FIG. 2 is a field-emission scanning electron micrograph of a titanium carbonitride powder of Sample No. 1-11 in Test Example 1.
Figure 3:
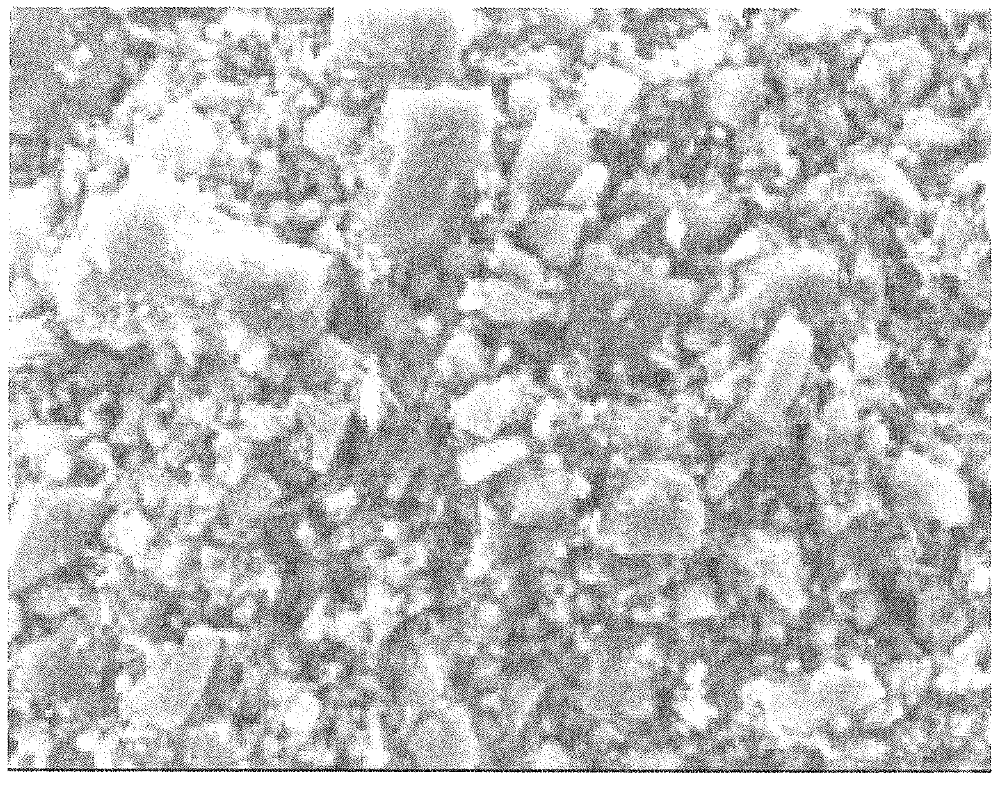
FIG. 3 is a field-emission scanning electron micrograph of a titanium carbonitride powder of Sample No. 1-12 in Test Example 1.

The grain size distribution by volume of each resulting sample titanium carbonitride powder was measured with a laser diffraction/scattering grain size distribution analyzer (Microtrac, manufactured by MicrotracBEL Corp.). The measurement conditions were as follows: wet measurement (solvent: ethanol); refractive index of solvent=1.36; refractive index of particles=2.4. Table 1 shows the grain size D10 at a cumulative percentage of 10%, the grain size D50 at a cumulative percentage of 50%, the grain size D90 at a cumulative percentage of 90%, and the calculated D10/D90 of the resulting grain size distribution. As representative examples, FIGS. 1 to 3 show photographs of the titanium carbonitride powders of Sample Nos. 1-1, 1-11, and 1-12 captured under a field-emission scanning electron microscope (FE-SEM, 5,000× magnification).

<<Measurement of Full Width at Half Maximum of Diffraction Peak>>

The full widths at half maximum of the X-ray diffraction peaks of the (2,0,0), (2,2,0), and (2,2,2) planes of each resulting sample titanium carbonitride powder were measured with Cu Kα X-rays. The results are also shown in Table 1.

TABLE 1

| Sample No. | D10 | D50 | D90 | D10/D90 | Full width at half maximum (°) (2, 0, 0) plane | (2, 2, 0) plane | (2, 2, 2) plane |
|---|---|---|---|---|---|---|---|
| 1-1 | 1.48 | 2.66 | 5.43 | 0.27 | 0.09 | 0.09 | 0.11 |
| 1-2 | 1.23 | 2.15 | 5.02 | 0.25 | 0.18 | 0.17 | 0.17 |
| 1-3 | 1.63 | 3.01 | 7.18 | 0.23 | 0.16 | 0.13 | 0.14 |
| 1-4 | 1.37 | 2.44 | 5.35 | 0.26 | 0.08 | 0.08 | 0.09 |
| 1-5 | 1.48 | 2.80 | 6.65 | 0.22 | 0.38 | 0.55 | 0.59 |
| 1-11 | 0.54 | 0.84 | 1.64 | 0.33 | 0.14 | 0.13 | 0.15 |
| 1-12 | 0.81 | 2.28 | 7.34 | 0.11 | 0.36 | 0.73 | 0.98 |

As can be seen from Table 1, Sample Nos. 1-1 to 1-5, which were prepared by mixing titanium oxide powder and carbon powder without pulverization, granulating the mixed powder, and heat-treating the granulated powder at a temperature of from 2,000° C. to 2,500° C. in a nitrogen-containing atmosphere, satisfied (A) a D50 of from 2.0 μm to 6.0 μm and (B) a D10/D90 of from 0.20 to 0.50. That is, Sample Nos. 1-1 to 1-5 were (A) coarse and (B) uniformly sized (see also FIG. 1). In contrast, Sample No. 1-11, which was prepared by heat treatment at a temperature of 1,700° C., satisfied (B) a D10/D90 of from 0.20 to 0.50, but had (A) a D50 of less than 2.0 μm. Sample No. 1-11 was (B) uniformly sized because the heat treatment step was performed while the grain size of the starting powders was maintained since mixing was performed without pulverization in the mixing step; however, this sample was (A) fine because the heat treatment step was performed at low temperature and thus failed to promote grain growth (see also FIG. 2). Sample No. 1-12, which was prepared by mixing and pulverizing the starting powders in a ball mill, heat-treating the mixed powder at a temperature of 1,600° C., and then pulverizing the powder, satisfied (A) a D50 of from 2.0 μm to 6.0 μm, but had (B) a D10/D90 of less than 0.20. Sample No. 1-12 was (B) not uniformly sized because this sample failed to maintain the grain size of the starting powders and became fine since pulverization was performed in the mixing step and also after heat treatment (see also FIG. 3).

Test Example 2

In Test Example 2, hard materials (Sample Nos. 2-1 to 2-5, 2-11, and 2-12) were prepared from the sample titanium carbonitride powders obtained in Test Example 1 and were assessed.

<<Sample Preparation>>

As starting powders, the sample titanium carbonitride powders obtained in Test Example 1 were provided (Sample Nos. 1-1 to 1-5, 1-11, and 1-12 were used for Sample Nos. 2-1 to 2-5, 2-11, and 2-12, respectively), and a commercially available WC powder (average grain size=1.0 μm), TaC powder (average grain size=0.7 μm), Co powder (average grain size=1.0 μm), and Ni powder (average grain size=1.5 μm) were also provided (providing step). The average grain sizes of the starting powders were determined by the FSSS method. These powders were blended in a ratio of TiCN-20WC-7TaC-8Co-8Ni and were mixed without pulverization in a ball mill to obtain mixed powders (mixing step).

Mixing was performed using water as a solvent and cemented carbide balls with a diameter of 5 mm as a media. The mixing time was as follows: 12 hours for Sample Nos. 2-1 to 2-5 and 2-11; 120 hours for Sample No. 2-12. The resulting mixed powders were press-compacted at 98 MPa to obtain compacts (compaction step). The resulting compacts were sintered in a vacuum atmosphere at 1,550° C. for 0.5 hours to obtain hard materials (sintering step).

<<Structure Observation>>

After the resulting sample hard materials were cut with a diamond blade, the cut surfaces were ground flat and mirror-finished with a #3000 diamond paste. These cross-sections were used as observation samples for microscopy.

Figure 4:
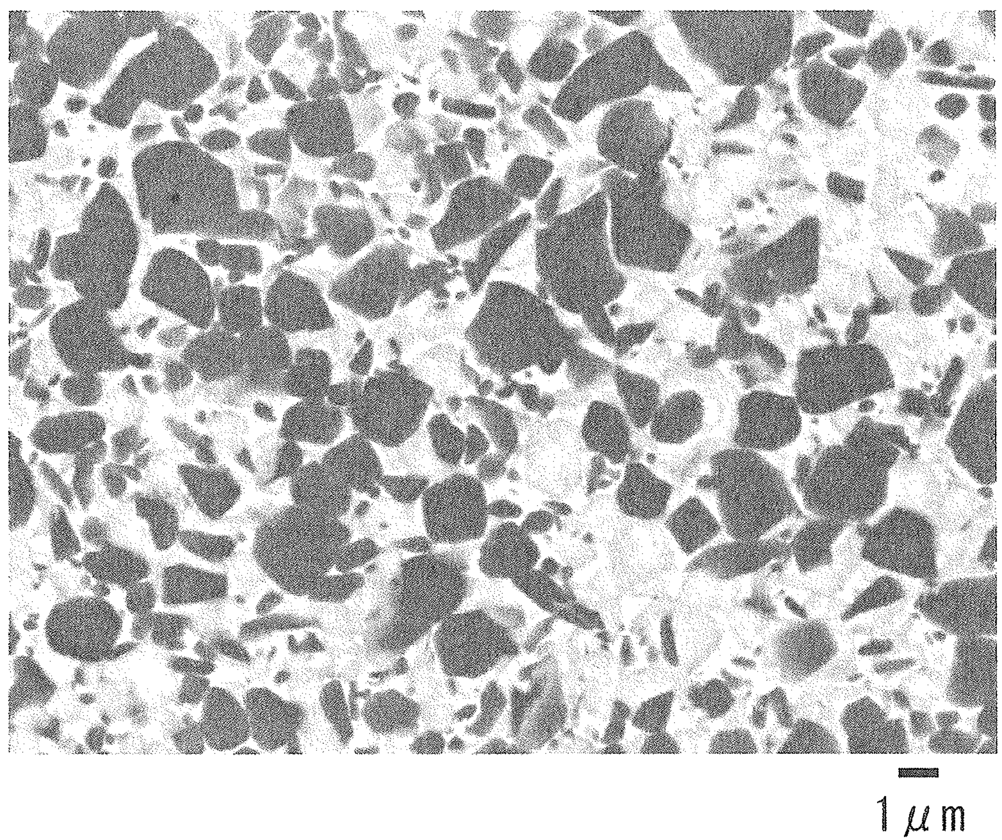
FIG. 4 is a field-emission scanning electron micrograph of a cross-section of a hard material of Sample No. 2-1 in Test Example 2.
Figure 5:
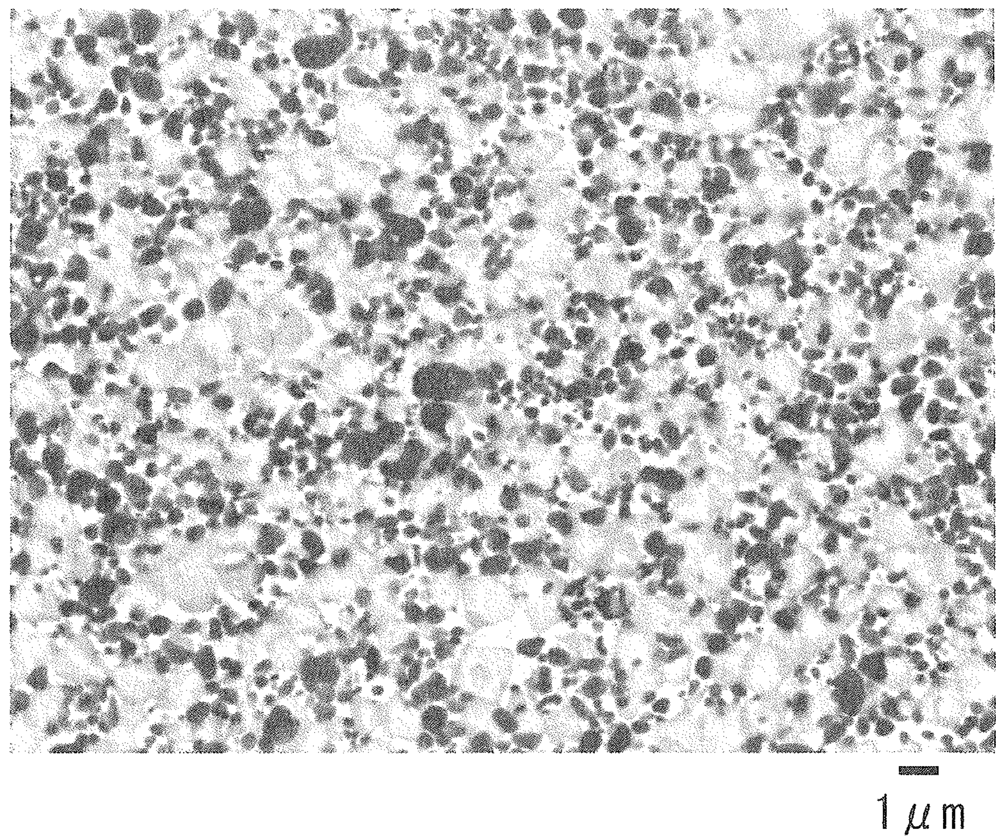
FIG. 5 is a field-emission scanning electron micrograph of a cross-section of a hard material of Sample No. 2-11 in Test Example 2.
Figure 6:
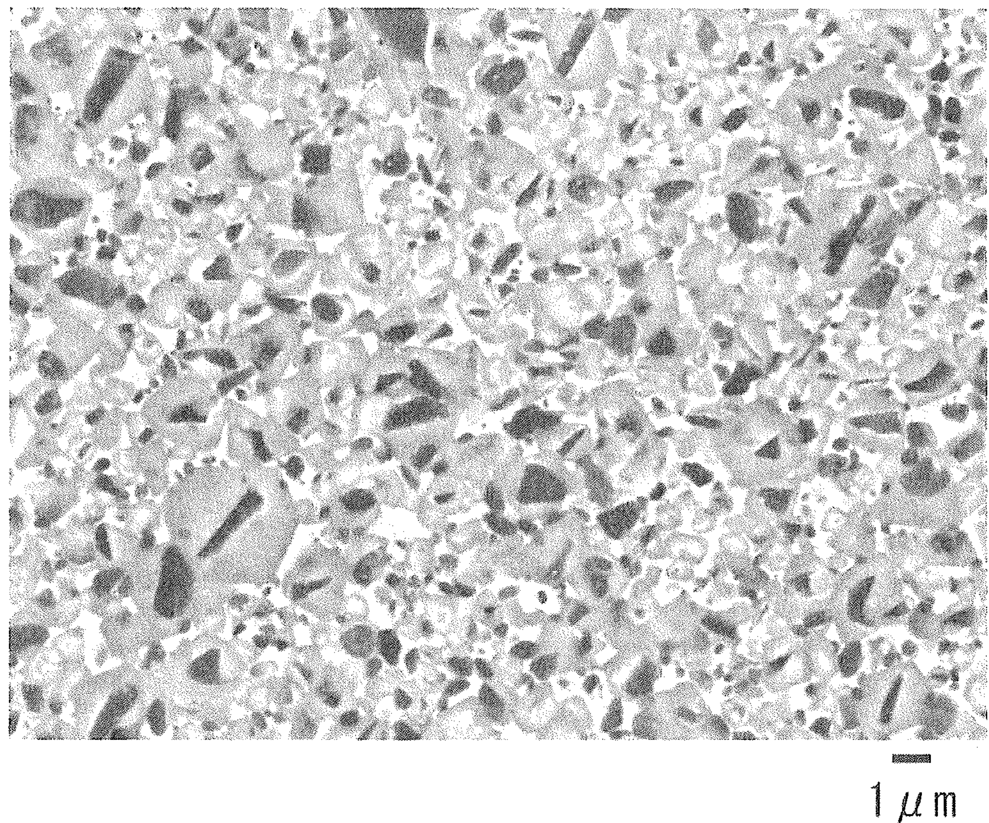
FIG. 6 is a field-emission scanning electron micrograph of a cross-section of a hard material of Sample No. 2-12 in Test Example 2.

Images of the machined surfaces of the observation samples were captured with a field-emission scanning electron microscope (FE-SEM) under the following conditions: acceleration voltage=15 kV; operating distance=10.0 mm; 5,000× magnification. As representative examples, FIGS. 4 to 6 show the photographs of the hard materials of Sample Nos. 2-1, 2-11, and 2-12. In FIGS. 4 to 6, the black area indicates a first hard phase formed of titanium carbonitride, the gray area indicates a second hard phase containing W and Ta, and the white area therebetween indicates a binder phase containing Co and Ni as major constituents. As can be seen from FIG. 4, the first hard phase was coarse and uniformly sized. In contrast, the first hard phase in FIG. 5 was fine, and the first hard phase in FIG. 6 was fine and had variations in grain size.

With these observation samples, 300 or more first hard phase (TiCN) particles per field of view were analyzed with the image analysis software "Image J" by the following procedure. First, the images captured under the FE-SEM were sent to a computer. The first hard phase, which looked dark, was extracted from the images and was binarized by the Threshold function. During this processing, a region where adjacent first hard phase particles were determined to be a single particle by binarization was modified to discrete first hard phase particles with reference to the original image. Conversely, regions where an originally single first hard phase particle was unintentionally divided were modified to a single first hard phase particle with reference to the original image. The Analyze Particles function was then used to determine the D50 and D20 (maximum Feret diameter), the aspect ratio (major axis/minor axis of an approximate ellipse), and the area of the first hard phase. First hard phase particles extending across the edges of the images were excluded from those subjected to analysis for grain size (D50 and D20) and aspect ratio, but were included in those subjected to analysis for area fraction.

The results of the grain size (D20 and D50), the aspect ratio, and the area fraction of the first hard phase are shown in Table 2.

<<Mechanical Properties>>

The Vickers hardness (GPa) and the fracture toughness ($MPa \cdot m^{0.5}$) of the machined surfaces of the observation samples were measured in accordance with JIS Z 2244 (2009) and JIS R 1607 (1995), respectively. The results are also shown in Table 2.

The thermal diffusivity, the specific heat, and the specific gravity of the hard materials at room temperature (20° C. to 22° C.) were also measured with a thermal diffusivity analyzer (LFA457 manufactured by Netzsch, Inc.), with a specific heat analyzer (STA449 manufactured by Netzsch, Inc.), and by Archimedes' method, respectively. These measurements were multiplied to determine the thermal conductivity (W/mK). Sapphire was used as a reference sample for specific heat measurement with an STA449. The results are also shown in Table 2.

TABLE 2

| Sample No. | D20 | D50 | Aspect Ratio | Area fraction (%) | Hardness (GPa) | Fracture toughness ($MPa \cdot m^{0.5}$) | Thermal conductivity W/mK |
|---|---|---|---|---|---|---|---|
| 2-1 | 1.10 | 1.68 | 1.65 | 49.6 | 13.4 | 7.2 | 20.0 |
| 2-2 | 0.74 | 1.08 | 1.54 | 38.7 | 13.7 | 6.8 | 19.8 |
| 2-3 | 1.30 | 1.92 | 1.60 | 51.2 | 13.2 | 7.5 | 21.2 |
| 2-4 | 0.87 | 1.37 | 1.57 | 43.5 | 13.6 | 7.0 | 20.2 |
| 2-5 | 1.05 | 1.88 | 1.66 | 40.3 | 13.2 | 7.1 | 18.6 |
| 2-11 | 0.36 | 0.51 | 1.55 | 33.3 | 14.3 | 6.4 | 17.2 |
| 2-12 | 0.52 | 0.91 | 2.05 | 22.1 | 14.2 | 6.3 | 14.5 |

As can be seen from Table 2, Sample Nos. 2-1 to 2-5, which were obtained using a coarse and uniformly sized TiCN powder as a starting powder, had a D50 of 1.0 μm or more and a D20 of 0.7 μm or more, i.e., were coarse, and had an aspect ratio of 2.0 or less, i.e., were circular in cross-section. As a result, Sample Nos. 2-1 to 2-5 had a fracture toughness of 6.8 $MPa \cdot m^{0.5}$ or more and a thermal conductivity of 18 W/m or more, indicating that both the fracture toughness and the thermal conductivity improved as compared to Sample Nos. 2-11 and 2-12, which were obtained from a fine TiCN powder. The fracture toughness and the thermal conductivity of Sample No. 2-11 decreased probably because the first hard phase had a small D50 due to the use of a fine TiCN powder. The fracture toughness and the thermal conductivity of Sample No. 2-12 decreased probably because the TiCN powder used was obtained by mixing with pulverization and thus had an irregular particle shape, and its irregular particle shape was reflected on the resulting hard material and thus resulted in an aspect ratio of more than 2.0. The hardness decreased as the titanium carbonitride powder became coarser. This is probably because, whereas the use of coarse titanium carbonitride powders allowed the formation of a coarse hard phase and thus improved the fracture toughness by a crack-propagation inhibiting effect (crack deflection effect), the hardness, which is a physical property that is in trade-off with fracture toughness, decreased.

Test Example 3

In Test Example 3, hard materials (Sample Nos. 3-1 to 3-8 and 3-11 to 3-14) were prepared from the same TiCN powders as those prepared in Test Example 1 and were assessed for cutting performance.

<<Sample Preparation>>

As starting powders, the powders shown in Table 3 were provided (providing step). The TiCN powders used were as follows: Sample No. 1-1 for Sample Nos. 3-1 to 3-8; Sample No. 1-11 for Sample Nos. 3-11 and 3-12; Sample No. 1-12 for Sample Nos. 3-13 and 3-14. The other powders included a WC powder with an average grain size of 1.0 μm, a TaC powder with an average grain size of 0.7 μm, a NbC powder with an average grain size of 1.1 μm, a $Mo_2C$ powder with an average grain size of 2.0 μm, a ZrCN powder with an average grain size of 2.5 μm, a VC power with an average grain size of 0.5 μm, a $Cr_3C_2$ powder with an average grain size of 1.6 μm, a Co powder with an average grain size of 1.0 μm, and a Ni powder with an average grain size of 1.5 μm. These powders were blended in the ratios shown in Table 3 and were mixed without pulverization in a ball mill to obtain mixed powders (mixing step). Mixing was performed using water as a solvent and cemented carbide balls with a diameter of 5 mm as a media. The mixing time was as follows: 12 hours for Sample Nos. 3-1 to 3-8, 3-11, and 3-12; 120 hours for Sample Nos. 3-13 and 3-14. The resulting mixed powders were press-compacted at 98 MPa to obtain compacts (compaction step). The resulting compacts were sintered in a vacuum atmosphere (100 Pa) at 1,550° C. for 1.0 hour to obtain hard materials (sintering step).

<<Structure Observation>>

The grain size (D20 and D50), the aspect ratio, and the area fraction of the first hard phase in each resulting hard material were determined as in Test Example 2. The results are also shown in Table 3.

TABLE 3

| Sample | TiCN starting | Design composition of starting powders (% by mass) | | | | | | | | | | D20 | D50 | Aspect | Area fraction |
|---|---|---|---|---|---|---|---|---|---|---|---|---|---|---|---|
| No. | material | TiCN | WC | TaC | NbC | $Mo_2C$ | ZrCN | VC | $Cr_3C_2$ | Co | Ni | (μm) | (μm) | ratio | (%) |
| 3-1 | Sample | 57 | 20 | 7 | 0 | 0 | 0 | 0 | 0 | 8 | 8 | 1.10 | 1.68 | 1.65 | 34.3 |
| 3-2 | No. 1-1 | 58 | 15 | 0 | 7 | 2 | 0 | 0 | 0 | 12 | 6 | 1.08 | 1.75 | 1.79 | 45.6 |
| 3-3 | | 72 | 12 | 0 | 0 | 0 | 0 | 0 | 0 | 16 | 0 | 1.15 | 1.84 | 1.65 | 60.9 |
| 3-4 | | 68 | 12 | 0 | 3 | 0 | 1 | 0 | 0 | 8 | 8 | 1.15 | 1.70 | 1.62 | 53.4 |
| 3-5 | | 52 | 18 | 5 | 5 | 0 | 0 | 0 | 0 | 5 | 15 | 1.19 | 1.95 | 1.64 | 46.9 |
| 3-6 | | 60 | 0 | 0 | 10 | 10 | 0 | 0 | 0 | 0 | 20 | 1.10 | 1.64 | 1.55 | 45.1 |
| 3-7 | | 48 | 20 | 10 | 0 | 7 | 0 | 1 | 0 | 7 | 7 | 1.12 | 2.00 | 1.58 | 46.5 |
| 3-8 | | 58 | 15 | 0 | 12 | 0 | 0 | 0 | 1 | 7 | 7 | 1.04 | 1.77 | 1.76 | 49.4 |
| 3-11 | Sample | 57 | 20 | 7 | 0 | 0 | 0 | 0 | 0 | 8 | 8 | 0.36 | 0.51 | 1.55 | 33.3 |
| 3-12 | No. 1-11 | 58 | 15 | 0 | 7 | 2 | 0 | 0 | 0 | 12 | 6 | 0.39 | 0.50 | 1.62 | 42.6 |
| 3-13 | Sample | 57 | 20 | 7 | 0 | 0 | 0 | 0 | 0 | 8 | 8 | 0.52 | 0.91 | 2.05 | 22.1 |
| 3-14 | No. 1-12 | 58 | 15 | 7 | 0 | 2 | 0 | 0 | 0 | 12 | 6 | 0.78 | 1.15 | 2.52 | 26.3 |

<<Cutting Test>>

The sample hard materials were subjected to cutting edge processing such as honing as appropriate to prepare substrates having the shape of CNMA120404. The surfaces of the samples were then coated with a TiAlN hard coating with an average thickness of 5 μm by a known PVD process. These samples were used to actually perform a cutting test under the cutting conditions shown in Table 4. The results are shown in Table 5.

TABLE 4

| | Fatigue toughness test | Thermal shock resistance test |
|---|---|---|
| | Workpiece | |
| | SCM415 (slot grooves, number of grooves: 4 grooves) | SCM435 (slot grooves, number of grooves: 3 grooves) |
| Cutting speed Vc (m/min) | 150 | 300 |
| Feed rate f (mm/rev) | 0.20 | 0.35 |
| Depth of cut ap (mm) | 1.5 | 2.0 |
| Cutting environment | DRY | WET |
| Method for assessment | Number of impacts to fracture (impacts) | Number of impacts to fracture (impacts) |

TABLE 5

| Sample No. | Fatigue toughness | Thermal shock resistance |
|---|---|---|
| 3-1 | 4088 | 6588 |
| 3-2 | 4226 | 7383 |
| 3-3 | 3420 | 8073 |
| 3-4 | 3654 | 6726 |
| 3-5 | 3144 | 8190 |
| 3-6 | 3790 | 8025 |
| 3-7 | 4462 | 6678 |
| 3-8 | 3458 | 7032 |
| 3-11 | 1100 | 5475 |
| 3-12 | 1126 | 5025 |
| 3-13 | 1996 | 3315 |
| 3-14 | 2042 | 3678 |

As can be seen from Table 5, Sample Nos. 3-1 to 3-8, which were prepared using a coarse and uniformly sized TiCN powder as a starting powder and in which the first hard phase had a D50 of 1.0 μm or more and a D20 of 0.7 μm or more, i.e., was coarse, and had an aspect ratio of 2.0 or less, i.e., was circular in cross-section, had both superior fracture toughness and superior thermal shock resistance.

The invention claimed is:

1. A hard material comprising a first hard phase substantially composed only of titanium carbonitride and a binder phase containing an iron group element as a major constituent, wherein, in any surface or cross-section of the hard material, a grain size D50 at a cumulative percentage of 50% of a grain size distribution by area of the first hard phase is 1.0 μm or more, and an average aspect ratio of first hard phase particles having grain sizes larger than or equal to D50 is 2.0 or less.

2. The hard material according to claim 1, wherein, in the surface or cross-section, a grain size D20 at a cumulative percentage of 20% of the grain size distribution by area of the first hard phase is 0.7 μm or more.

3. The hard material according to claim 1, wherein an area fraction of the first hard phase in the surface or cross-section is 30% or more.

4. The hard material according to claim 1, further comprising a second hard phase consisting of one or more of carbides, nitrides, carbonitrides, and solid solutions thereof containing one or more metal elements selected from elements in groups 4, 5, and 6 of the periodic table (excluding titanium carbonitride).

5. A cutting tool comprising the hard material according to claim 1 as a substrate.

6. The cutting tool according to claim 5, wherein the cutting tool has a hard coating on at least a portion of a surface of the substrate.

* * * * *